(12) United States Patent
Simizu (10) Patent No.: US 6,621,090 B2
(45) Date of Patent: Sep. 16, 2003

(54) ELECTRON-BEAM SOURCES EXHIBITING REDUCED SPHERICAL ABERRATION, AND MICROLITHOGRAPHY APPARATUS COMPRISING SAME

(75) Inventor: Hiroyasu Simizu, Kawasaki (JP)

(73) Assignee: Nikon Corporation, Tokyo (JP)

( * ) Notice: Subject to any disclaimer, the term of this patent is extended or adjusted under 35 U.S.C. 154(b) by 81 days.

(21) Appl. No.: 09/901,766

(22) Filed: Jul. 9, 2001

(65) Prior Publication Data

US 2002/0008209 A1 Jan. 24, 2002

(30) Foreign Application Priority Data

Jul. 10, 2000 (JP) .......................................... 2000-208156

(51) Int. Cl.$^7$ ........................ H01J 37/06; H01J 37/305; G03F 7/20; G21K 1/00; G21K 5/04

(52) U.S. Cl. ................................. 250/492.2; 250/492.3
(58) Field of Search ........................... 250/492.2, 492.3, 250/310

(56) References Cited

U.S. PATENT DOCUMENTS 6,365,897 B1 * 4/2002 Hamashima et al. ........ 250/310

* cited by examiner

Primary Examiner—Huan Tran
(74) Attorney, Agent, or Firm—Klarquist Sparkman LLP (57) ABSTRACT

Electron-beam sources are disclosed that exhibit substantially reduced spherical aberration compared to conventional sources. In a beam produced by the cathode of such a source, axially propagating electrons are subjected to a lens action by voltage applied to a Wehnelt electrode and an extraction electrode. The cathode includes a peripheral portion that is "drawn back" (displaced along the axis of the source away from the beam-propagation direction) relative to a center portion of the cathode. With such a cathode, the percentage of dimensions of the crossover involved in spherical aberration of the crossover is reduced. This improves the uniformity of beam current at a lithographic substrate and minimizes location-dependency of the aperture angle. Since the Wehnelt voltage can be reduced, positional changes in the electrical field at the cathode surface are reduced, and the distribution of electrons in the beam propagating from the cathode surface is made more uniform than conventionally.

30 Claims, 6 Drawing Sheets

ELECTRON-BEAM SOURCES EXHIBITING REDUCED SPHERICAL ABERRATION, AND MICROLITHOGRAPHY APPARATUS COMPRISING SAME

FIELD OF THE INVENTION

This invention pertains to high-emittance electron-beam sources for use in any of various electron-beam devices, particularly electron-beam microlithography apparatus and related exposure apparatus. Electron-beam microlithography is a type of charged-particle-beam microlithography, which represents one of several "next-generation" microlithography technologies currently experiencing intensive development effort due to its potential for achieving substantially greater resolution than obtainable using conventional optical microlithography technology. Microlithography is a key technology used in the manufacture of microelectronic devices such as integrated circuits, displays, thin-film magnetic pickup heads, micromachines, and the like.

BACKGROUND OF THE INVENTION

Figure 7:
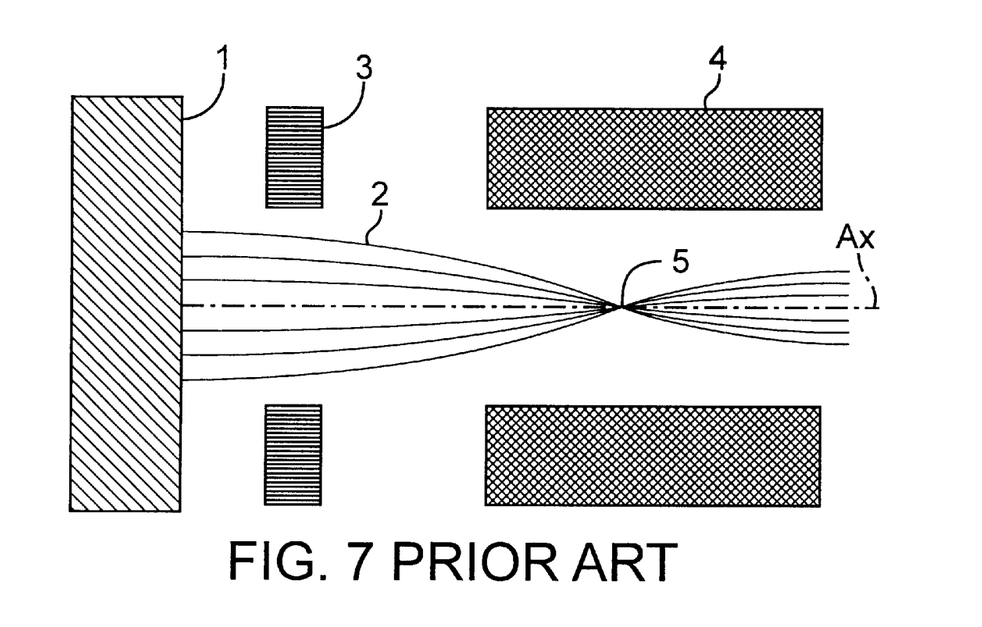
FIG. 7 is a sagittal section of a conventional electron-beam source.

A conventional thermionic electron-beam source (also termed an "electron gun") is shown in FIG. 7. The depicted source includes a cathode 1 (serving as the electron-emitting surface), a Wehnelt electrode 3, and an "extraction electrode" (anode) 4 arranged along an axis Ax. The cathode 1 normally is heated by a heating means (not shown but well understood in the art) to cause the cathode to emit hot electrons. The emitted electrons are formed into a beam 2 by the Wehnelt electrode 3 and anode 4. Specifically, the anode 4 extracts electrons emitted from the cathode 1 and urges them to propagate in a downstream direction (to the right in the figure) from the cathode to the anode 4 and beyond. Electrons of a beam 2 emitted from the cathode 1 and propagating initially parallel to the axis Ax (i.e., axially propagating electrons) are subjected to respective lens actions by the respective voltages applied to the Wehnelt electrode 3 and anode 4. The electrons of the beam 2 converge at a gun crossover 5. The axial position of the gun crossover 5 is a function of the respective voltages applied to the Wehnelt electrode 3 and anode 4 (e.g., a higher negative voltage applied to the Wehnelt electrode 3 will tend to move the gun crossover 5 to the left in the figure). In a microlithography context, the beam 2 propagating downstream of the anode 4 is acted upon by a downstream electron-optical system (not shown) that shapes and conditions the beam for use as an illumination beam for illuminating a desired region of a reticle or mask or other object (not shown).

In certain types of electron-beam apparatus the emittance of the electron gun is critical, especially if the apparatus is used for making one-shot lithographic exposures of respective portions of a pattern, or for making reduced (demagnified) transfer-exposures of a pattern. "Emittance" is a quantitative expression of the ability of the beam to achieve uniform irradiation of a defined surface, and is expressed as the range of uniform beam current in an area irradiated by the electron beam 2 multiplied by the aperture half-angle of the beam at the irradiated region.

In electron microscopes and microlithography apparatus utilizing an electron beam having a transversely Gaussian distribution but configured as a spot beam for pattern drawing, emittance normally is not a significant variable. This is because the area illuminated by a spot beam at any instant in time is only 1 to 10 nm in diameter, which is effectively at the apex of the distribution. In contrast, in microlithography apparatus utilizing a reticle divided into subfields that are exposed individually with demagnification, merely forming the beam to irradiate a spot is insufficient for achieving proper pattern transfer because the area illuminated by the electron beam is substantially larger than 1–10 nm across. Rather, it is necessary to achieve uniform irradiation in an area measuring 10 $\mu$m square (typical of one-shot partial pattern block exposures) to 1 mm square (typical of one-shot reduced transfer exposures from respective subfields of a divided reticle). These latter areas encompass not only the apex of the Gaussian distribution but also the tails (distal or outlying portions) of the distribution. In addition, the aperture half-angle in these latter two cases is several mrad. As a result, to achieve the required uniform illumination over the desired one-shot area, high emittance from the electron gun is necessary.

To improve the transverse uniformity of the energy of the electron beam emitted from the electron gun used in apparatus for performing partial pattern block exposures and reduced transfer exposures from a divided reticle, the cathode normally is made transversely wide and planar as shown in FIG. 7. A wide planar cathode also improves the uniformity of beam current as incident on a substrate such as a semiconductor wafer when forming a microlithographic image of the cathode on the substrate. However, whenever electrons are emitted from a wide cathode surface, beam current tends to be excessive. Hence, various means conventionally are employed to prevent emission of extraneous electrons from the cathode. Exemplary conventional means include fabricating the cathode of a material having a high work function or applying a substance having a high work function to portions of the cathode surface located off axis.

Figure 10:
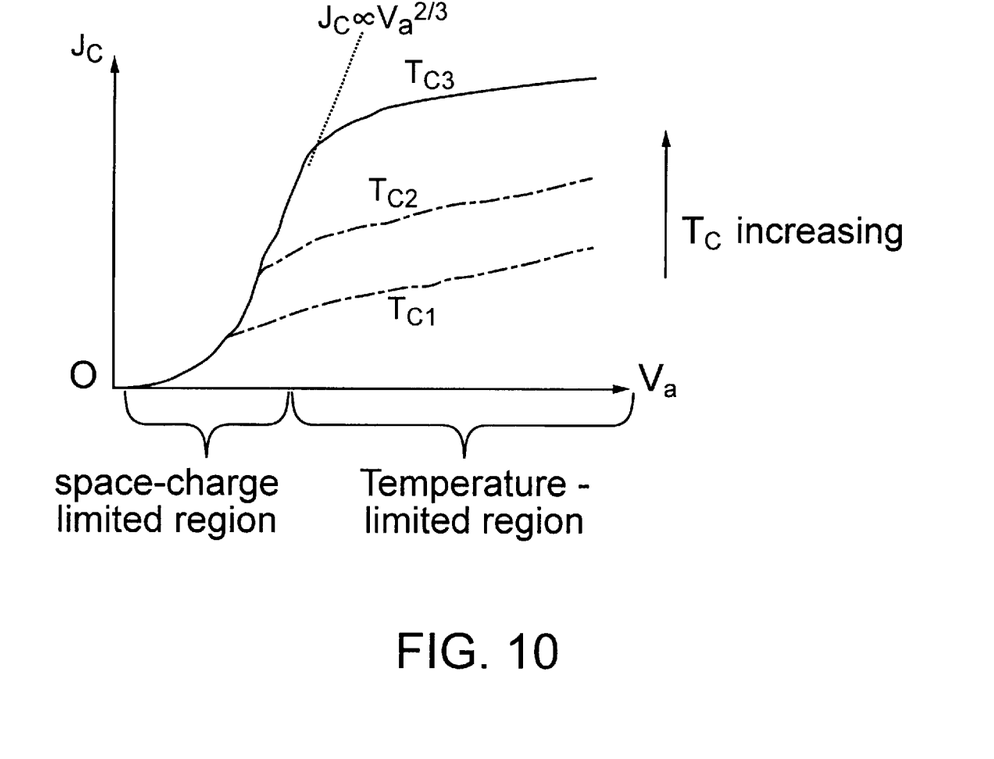
FIG. 10 is a representative plot of emission-current density $J_c$ and anode voltage $V_a$ for an electron gun.

If the cathode is a thermionic-emission type, the electron gun generally exhibits a relationship between emission-current density $J_c$ and anode voltage $V_a$ as shown in FIG. 10. In the figure $T_c$ is cathode temperature. For example, the relationship of $J_c$ versus $V_a$ for $T_{c3}$ is indicated by the solid-line curve. The region where the relationship of $J_c$ versus $V_a$ is nearly according to $J_c V_a^{2/3}$ is termed a "space-charge-limited" region. The more distal region is a "temperature-limited" region.

As the temperature of a thermionic cathode rises, beam current can become excessively high, and operation of the electron gun becomes space-charge limited. Whereas operation of the gun in a space-charge-limited manner can be performed in a stable manner, the presence of a high-charge field at or adjacent the cathode surface can cause the emitted electrons to lose characteristics reflective of the cathode surface from which they were emitted. If the electric field is substantially non-uniform, then electron emission from the cathode surface is not uniform. Under such conditions, the uniformity of current at the cathode surface conventionally cannot be utilized. Hence, there is a need for a way in which to utilize the electron gun in a temperature-limited region having a relatively low temperature and low beam current at the cathode.

Figure 8:
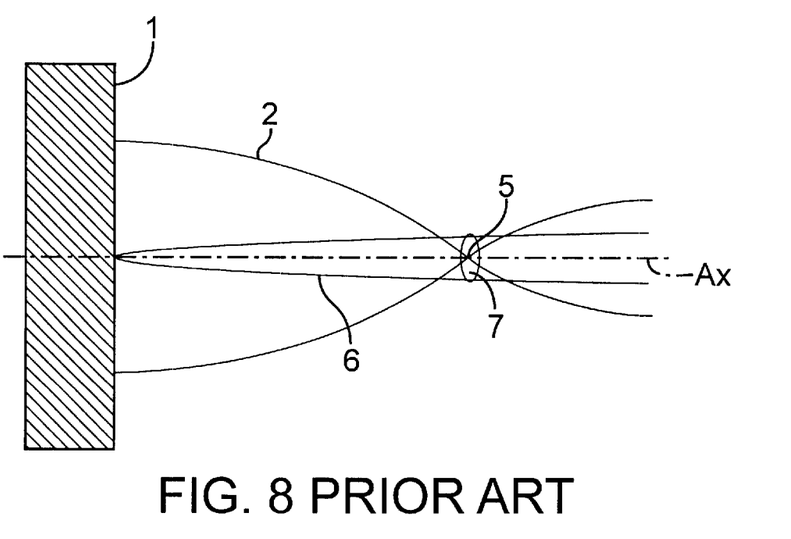
FIG. 8 depicts exemplary trajectories of electrons from the cathode of the electron-beam source of FIG. 7.

Meanwhile, the distribution of the aperture angle is determined by the transverse energy distribution of the beam, which is determined by the cathode temperature of the cathode as electrons are being emitted from the cathode. The trajectories of electrons, emitted from the cathode 1 at a point of intersection of the optical axis Ax with the cathode surface, and emitted at an angle relative to the optical axis Ax are shown in FIG. 8. Near-axis trajectories 6 determine the configuration and dimensions of a crossover 7 formed at the crossover point 5. The spatial intensity of the beam at the crossover 7 is a function of the distribution of electron emission at the cathode surface, which (as discussed above) usually is a Gaussian distribution.

The emittance at a surface irradiated by the beam is determined not only by the uniformity of beam current and aperture angle at the cathode of the electron gun, but also by aberrations generated by lens actions generated by respective voltages applied to the electrodes of the electron gun. Whereas emittance can be preserved if the downstream optical system is free of aberrations, emittance is degraded by an optical system exhibiting significant aberrations. If emittance has deteriorated, it generally cannot be restored by the downstream optical system.

Figure 9:
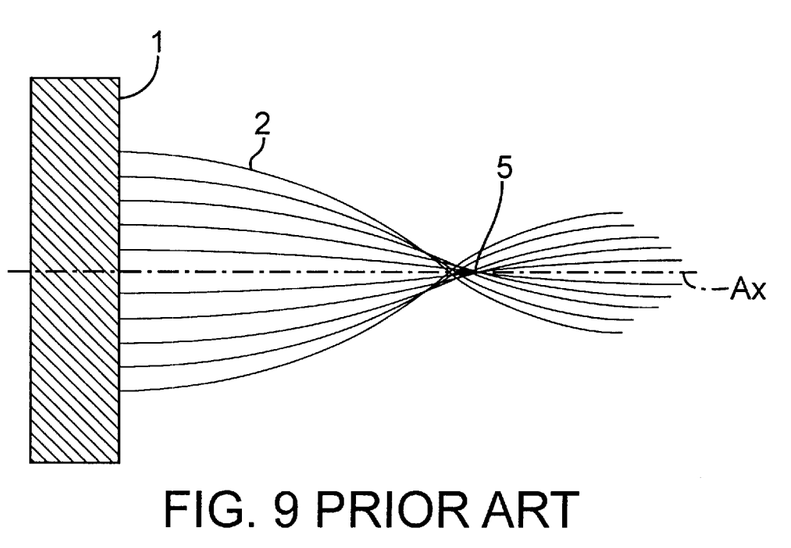
FIG. 9 depicts a spherical aberration at the crossover, as obtained with the electron-beam source of FIGS. 7 and 8.

In conventional electron guns, substantial aberrations are imparted to the image at the crossover point 5 by the respective lens actions of the Wehnelt electrode 3 and the anode 4, as shown in FIG. 9, depicting a spherical aberration. Whenever spherical aberration is evident at the crossover point 5, the beam current is irregular and aperture angle becomes location-dependent at the wafer or other substrate. This, in turn, causes a substantial degradative deviation of actual emittance from the desired emittance, and results in a deterioration of the uniformity of imaging performed by the beam.

Therefore, there is a demand for electron-beam sources that exhibit substantially reduced spherical aberration at a crossover compared to conventional electron-beam sources.

SUMMARY OF THE INVENTION

In view of the shortcomings of the prior art as summarized above, an object of the invention is to provide electron-beam sources that exhibit substantially reduced spherical aberration compared to conventional sources.

To such end, and according to a first aspect of the invention, electron-beam sources are provided. An embodiment of an electron-beam source according to the invention comprises a cathode situated on an axis and configured to emit an electron beam propagating along the axis in a downstream direction from the cathode. The cathode comprises a transversely planar center portion and a transversely planar peripheral portion. The peripheral portion is "drawn back" in an upstream direction along the axis relative to the center portion.

Drawing back the peripheral portion of the cathode relative to the center portion provides several advantages. One advantage is that peripheral portions of a beam exhibiting spherical aberrations can be effectively blocked using a downstream aperture situated at a crossover image plane. This results in a more uniform transverse beam-intensity distribution immediately downstream of this image plane. Another advantage is that a more uniform angular distribution of the beam at the reticle and wafer is obtained. Hence, if the beam source is used in an electron-beam microlithography apparatus, drawing back the peripheral portion of the cathode yields a corresponding improvement of the uniformity of beam current at the wafer and reduces the location-dependency of the aperture angle of the beam. This drawing back also allows the voltage applied to a Wehnelt electrode of the source to be reduced, yielding improved uniformity of the electrical field at the electron-emitting surface of the cathode, with a correspondingly improved uniformity of the distribution of electrons extracted from the electron-emitting surface. These benefits yield a substantially improved emittance compared to conventional electron-beam sources.

As suggested in the summary above, the subject electron-beam source can further include a Wehnelt electrode situated coaxially downstream of the cathode, and an extraction electrode (also termed an anode) situated coaxially downstream of the Wehnelt electrode.

According to another aspect of the invention, methods are provided (in the context of producing an electron beam using an electron gun including a cathode and a Wehnelt electrode arranged along an optical axis) for increasing uniformity of a field at an electron-emitting surface of the cathode. In an embodiment of such a method, the cathode is configured with a transversely planar center portion and a transversely planar peripheral portion. The peripheral portion is drawn back, relative to the center portion, in an upstream direction along the optical axis. This drawing back weakens a field imposed at the electron-emitting surface.

According to another aspect of the invention, electron-beam microlithography apparatus are provided that include an electron-beam source such as any of those, according to the invention, summarized above. Since the electron-beam source is characterized by having a high emittance, the subject apparatus is especially suitable for use in achieving uniformity of illumination of a selected region on a reticle. The subject apparatus also is especially suitable for use in lithographic situations requiring high emittance, such as partial pattern block exposure and/or reduced transfer-exposure of a pattern from a divided ("segmented") reticle.

An electron-beam microlithography apparatus according to the invention can include an illumination-optical system and a projection-optical system. The illumination-optical system is situated along the axis downstream of the source. The illumination-optical system is configured to receive the electron beam, propagating as an illumination beam from the source, and to direct the electron beam to a reticle so as to illuminate a region on the reticle. The projection-optical system is situated along the axis downstream of the reticle. The projection-optical system is configured to receive the electron beam, propagating as a patterned beam from the reticle, and to direct the patterned beam to a substrate (e.g., semiconductor "wafer" coated with a suitable resist).

The foregoing and additional features and advantages of the invention will be more readily apparent from the following detailed description, which proceeds with reference to the accompanying drawings.

BRIEF DESCRIPTION OF THE DRAWINGS

FIG. 2 shows plots of the dimensional percentage of the crossover significantly affected by spherical aberration, versus the voltage impressed on the extraction electrode (anode) of the electron-beam source. In the plots, the coordinates indicated by diamonds are of an example of the embodiment shown in FIG. 1 (wherein the peripheral portion of the cathode is "drawn back" 4 mm relative to the center portion of the cathode), the coordinates indicated by squares are of a conventional electron-beam source such as that shown in FIG. 7 (wherein the cathode has a peripheral portion that is flush (i.e., coplanar with) the center portion thereof), and the respective coordinates indicated by triangles and circles are of respective examples in which the peripheral portion of the cathode is "drawn forward" 1 and 2 mm, respectively, relative to the center portion thereof.

DETAILED DESCRIPTION

The invention is described below in the context of representative embodiments, which are not to be regarded as limiting in any way.

Figure 1:
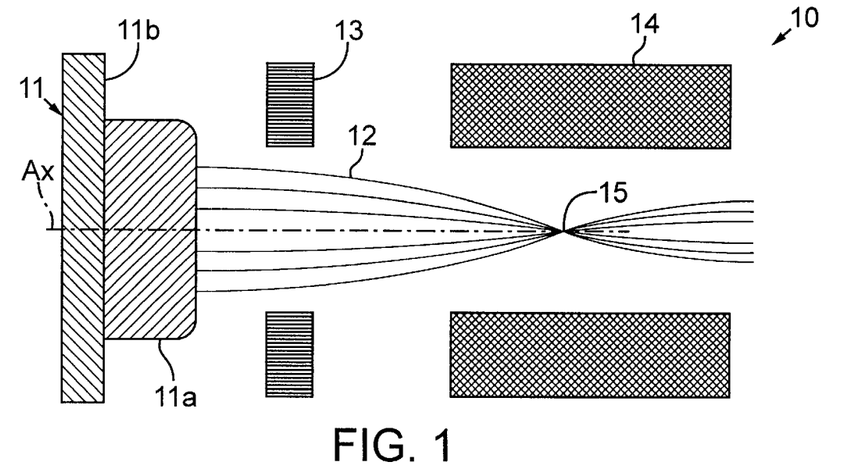
FIG. 1 is a sagittal section of an electron-beam source according to a representative embodiment of the invention

A first representative embodiment of an electron-beam source 10 according to the invention is depicted in FIG. 1. The source 10 comprises a cathode 11 including a center portion 11a and a peripheral portion 11b. The center portion 11a produces an electron beam 2 that propagates axially downstream (to the right in the figure) of the cathode 11 along an axis Ax. The source 10 also comprises a Wehnelt electrode 13 and an "extraction electrode" (anode) 14. The beam 12 forms a gun crossover 15 on the axis Ax in the vicinity of the anode 14.

Comparing FIGS. 1 and 7, it can be seen that, in FIG. 1, the peripheral portion 11b of the cathode 11 is displaced ("drawn back"), along the axis Ax, from the center portion 11a in a direction opposite the direction of electron propagation from the cathode 11.

Figure 2:
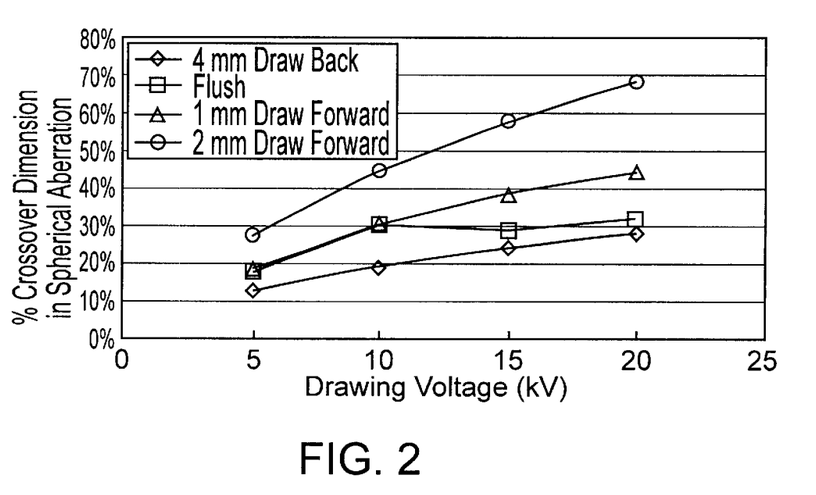
Figure 3:
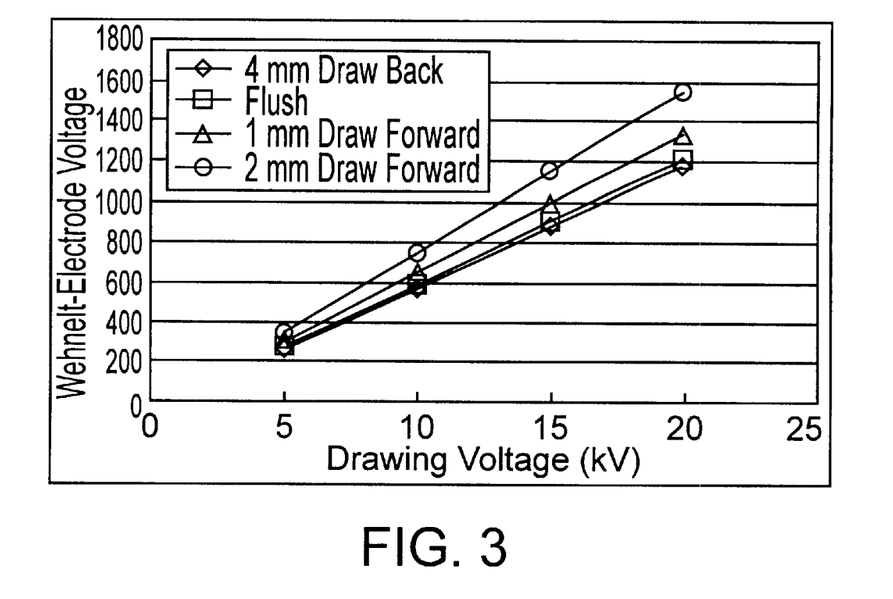
FIG. 3 shows plots of the applied voltage to the Wehnelt electrode versus the voltage impressed on the extraction electrode of the electron-beam source. In the plots, the respective coordinates indicated by diamonds, squares, triangles, and circles are as described above in the summary of FIG. 2.

The performance of the electron-beam source 10 of FIG. 1 is depicted in FIGS. 2 and 3. Specifically, FIG. 2 shows plots of the dimensional percentage of the crossover significantly affected by spherical aberration, versus the voltage (kV) impressed on the extraction electrode 15, by electron-beam sources having various respective configurations of the peripheral portion 11b relative to the center portion 11a. The plot connecting coordinates indicated by diamonds corresponds to an example in which the peripheral portion 11b is drawn back 4 mm from the center portion 11a. The respective plots connecting coordinates indicated by triangles and circles correspond to respective comparison examples in which the peripheral portion 11b is "drawn forward" 1 mm and 2 mm, respectively, relative to the center portion 11a. "Drawn forward" means that the peripheral portion 11b is situated downstream (to the right in FIG. 1) relative to the center portion 11a. The plot connecting coordinates indicated by squares corresponds to a comparison example in which the center portion 11a and peripheral portion 11b are transversely flush with each other, similar to the conventional configuration shown in FIG. 7. FIG. 3 shows similar plots, but in which the ordinate is the applied voltage to the Wehnelt electrode.

To obtain the plots shown in FIGS. 2 and 3, the voltage applied to the Wehnelt electrode 13 was changed while maintaining a constant axial position of the gun crossover 15. As can be discerned in FIG. 2, the dimensional percentage of the crossover significantly affected by spherical aberration is smallest whenever the peripheral portion 11b is drawn back from the center portion 11a (curve connecting the diamonds) according to the invention. As can be discerned from FIG. 3, the voltage applied to the Wehnelt electrode is lowest whenever the peripheral portion 11b is drawn back from the center portion 11a, according to the invention.

Further with respect to the results shown in FIG. 3, with an increase in voltage applied to the Wehnelt electrode 13, the electrical field imposed on the surface of the cathode 11 is increased correspondingly. This causes the field distribution at the cathode surface to become irregular. Such irregularity causes a deterioration of the desired uniformity with which electrons are drawn from the cathode surface. By drawing the peripheral portion 11b of the cathode 11 back from the center portion 11a, the Wehnelt voltage can be reduced. This weakens the field at the cathode surface, with a corresponding improvement of the uniformity of the field at the cathode surface.

Figure 4:
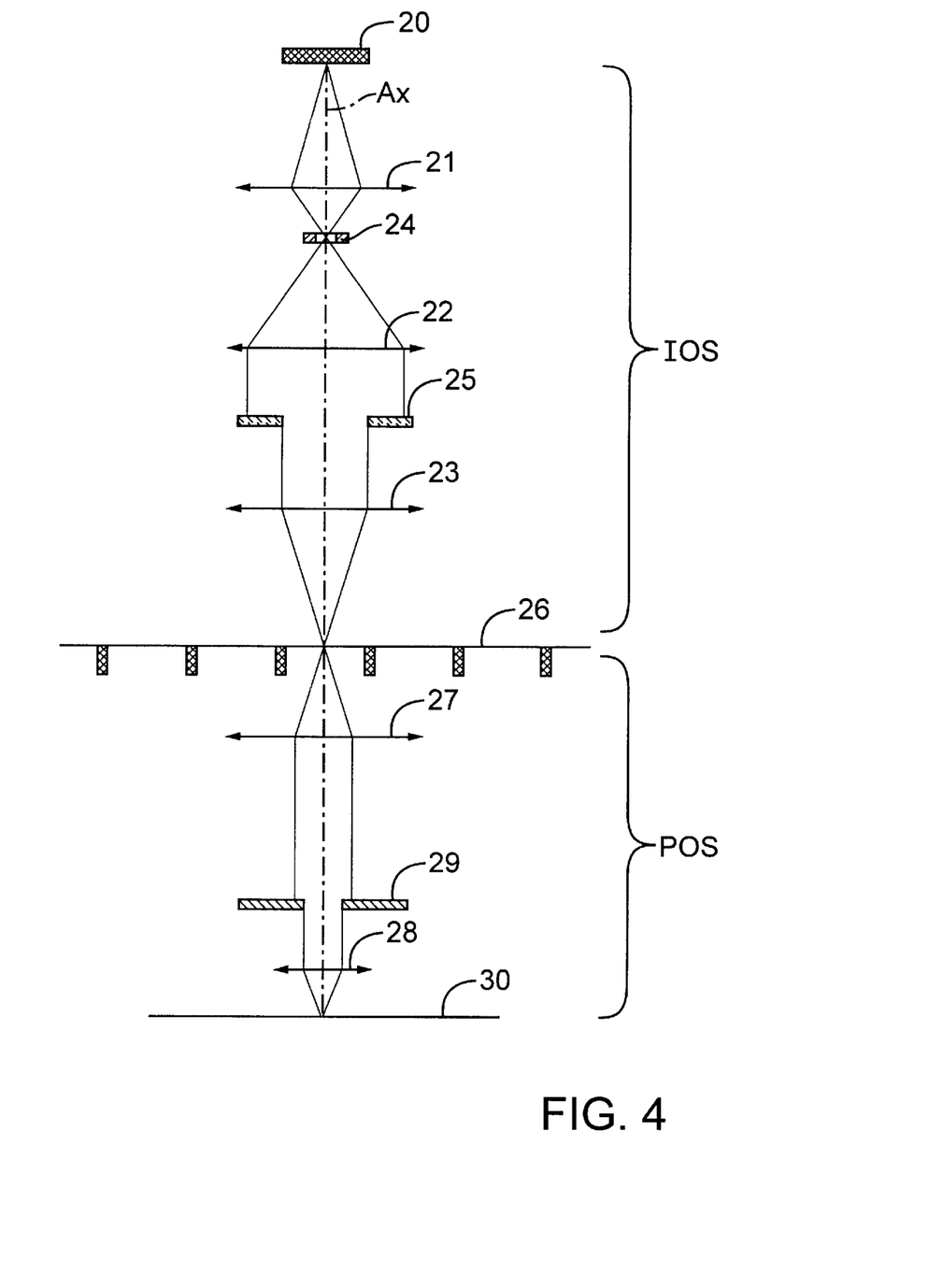
FIG. 4 is an elevational schematic diagram of a representative embodiment of an electron-beam microlithography apparatus according to the invention.
Figure 5:
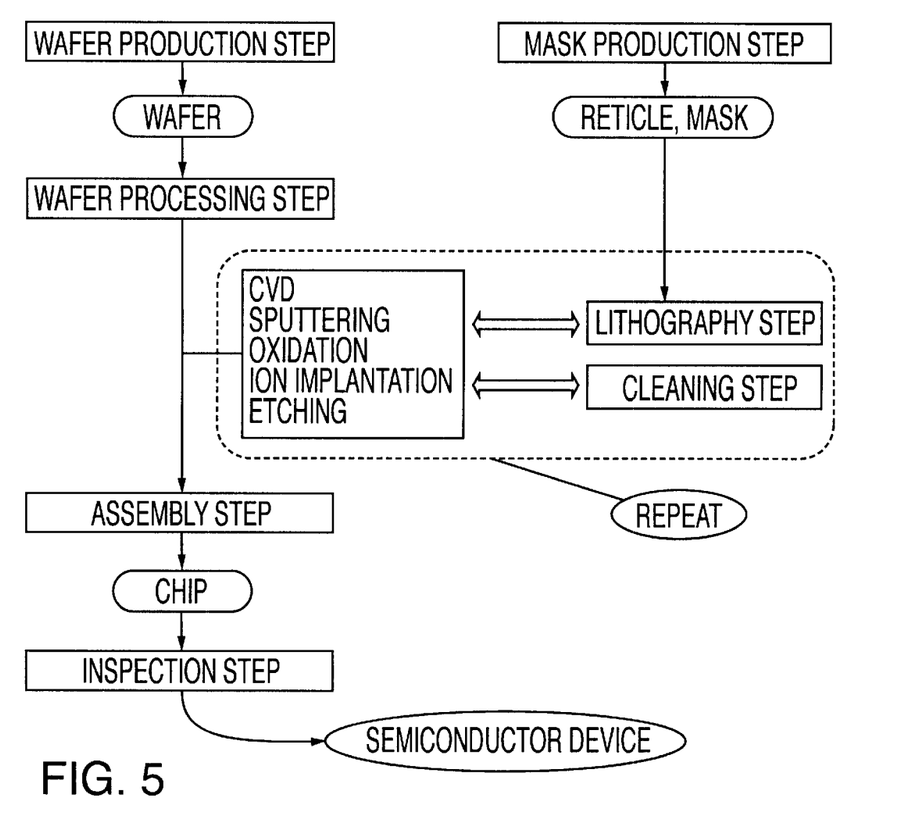
FIG. 5 is a flow chart of certain steps in a process for manufacturing a microelectronic device.

FIG. 4 depicts a representative embodiment of an electron-beam microlithography apparatus that comprises an electron-beam source 20 according to the invention (e.g., a source 10 as shown in FIG. 1). Arranged along an optical axis Ax are the electron-beam source 20, a first illumination lens 21, a second illumination lens 22, a third illumination lens 23, a beam-shaping aperture 24, an illumination aperture 25, a reticle 26 that defines a pattern, a first projection lens 27, a second projection lens 27, a projection aperture 29, and a substrate ("wafer") 30. The portion of the system between the source 20 and the reticle 26 is the "illumination-optical system" IOS, and the portion of the system between the reticle 26 and the wafer 30 is the "projection-optical system" POS. An electron beam emitted from the electron-beam source 20 propagates as an "illumination beam" through the illumination-optical system IOS and as a "patterned beam" through the projection-optical system POS.

The illumination beam emitted from the electron-beam source 20 is formed by the illumination lenses 21–23 and shaped by the apertures 24, 25 to illuminate a desired region on the reticle 26. The beam-shaping aperture 24 trims the beam as required to illuminate the region on the reticle 26 having a desired dimension. The plane of the aperture 25 desirably is conjugate to the gun crossover 15 of the electron-beam source 10 shown in FIG. 1 (i.e., an image of the crossover 15 is formed on the plane of the aperture 25). Beam uniformity at this plane defines the uniformity of the angular distribution of the beam at the reticle 26 and/or wafer 30. The beam profile at the gun crossover 15 is Gaussian, and the plate defining the aperture 25 normally trims (blocks) the tails of the Gaussian distribution of the beam. However, if the beam exhibits significant spherical aberration at the aperture 25, then tail portions of the beam distribution pass through the aperture 25 to the reticle rather than being blocked by the aperture plate. This results in deterioration of beam uniformity at the reticle.

An image of the illuminated region on the reticle 26 is formed on the wafer 30 by the first and second projection lenses 27, 28 working in concert with each other. So as to be imprinted with an image of the illuminated pattern projected from the reticle 26, the upstream-facing surface of the wafer 30 includes a layer of a suitable exposure-sensitive agent (termed a "resist"). The apertures 25 and 29 trim away scattered electrons and limit the aperture angle on the reticle and wafer, respectively. These various components (except for configuration of the electron-beam source 20) can have the same respective structures and functions as corresponding elements in a conventional microlithography apparatus.

In the embodiment shown in FIG. 4, the electron-beam source 20 can be similar to that shown in FIG. 1, discussed above. With such a configuration of a microlithography apparatus, a comparatively large area of the reticle 26 can be illuminated uniformly. Hence, it now is possible to transfer-expose patterns having finer linewidths than conventionally possible, with excellent accuracy and precision, even when the per-shot area of the reticle has a relatively large surface area.

Figure 6:
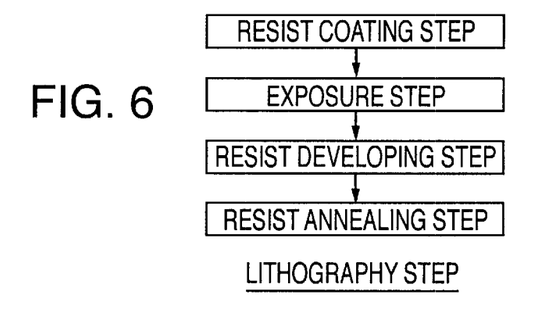
FIG. 6 is a flow chart of certain steps in the microlithography step of the process depicted in FIG. 5.

FIG. 6 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

FIG. 7 provides a flowchart of typical steps performed in microlithography, which is a principal step in the wafer-processing step shown in FIG. 6. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. An electron-beam source, comprising a cathode situated on an axis and configured to emit an electron beam propagating along the axis in a downstream direction from the cathode, the cathode comprising a transversely planar center portion and a transversely planar peripheral portion, the peripheral portion being drawn back in an upstream direction along the axis relative to the center portion.

2. The electron-beam source of claim 1, further comprising:
   a Wehnelt electrode situated coaxially downstream of the cathode; and
   an extraction electrode situated coaxially downstream of the Wehnelt electrode.

3. The electron-beam source of claim 2, wherein the Wehnelt electrode and extraction electrode are configured to form a gun crossover at which the electron beam has a Gaussian distribution.

4. The electron-beam source of claim 1, further configured to operate in a temperature-limited region at a cathode temperature and cathode beam current sufficiently low such that electrons emitted from the cathode have characteristics reflective of the planar surfaces of the cathode.

5. In a method for producing an electron beam using an electron gun including a cathode arranged along an optical axis, a method for increasing uniformity of a field at an electron-emitting surface of the cathode, the method comprising:
   configuring the cathode with a transversely planar center portion and a transversely planar peripheral portion; and
   drawing back the peripheral portion in an upstream direction along the optical axis relative to the center portion, so as to weaken a field imposed at the electron-emitting surface.

6. The method of claim 5, further comprising operating the cathode at a beam current and temperature such that the electron gun operates in a temperature-limited region, and electrons emitted from the cathode have characteristics reflective of the planar surfaces of the cathode.

7. The method of claim 5, further comprising:
   providing a Wehnelt electrode axially downstream of the cathode; and
   forming a gun crossover axially downstream of the Wehnelt electrode.

8. The method of claim 7, further comprising:
   providing an extraction electrode axially downstream of the Wehnelt electrode; and
   forming the gun crossover on the optical axis at the extraction electrode.

9. The method of claim 7, further comprising:
   providing an aperture plate downstream of the gun crossover at a location conjugate to the gun crossover, the aperture plate defining an aperture situated on the optical axis; and
   passing the electron beam through the aperture.

10. The method of claim 9, wherein:
    the electron beam entering the gun crossover has a Gaussian distribution; and
    the aperture is configured to trim outlying portions of the Gaussian distribution as the electron beam passes through the aperture.

11. In a method for producing an electron beam using an electron gun including a cathode, a Wehnelt electrode, and an extraction electrode arranged along an optical axis, the electron gun producing a gun crossover, a method for increasing uniformity of the electron beam at a location conjugate to the gun crossover, the method comprising:
    configuring the cathode with a transversely planar center portion and a transversely planar peripheral portion; and drawing back the peripheral portion in an upstream direction along the optical axis relative to the center portion.

12. The method of claim 11, further comprising operating the cathode at a beam current and temperature such that the electron gun operates in a temperature-limited region and electrons emitted from the cathode have characteristics reflective of the planar surfaces of the cathode.

13. The method of claim 11, further comprising forming a gun crossover on the optical axis downstream of the Wehnelt electrode.

14. The method of claim 13, further comprising:
providing an aperture plate downstream of the gun crossover at a location conjugate to the gun crossover, the aperture plate defining an aperture situated on the optical axis; and
passing the electron beam through the aperture.

15. The method of claim 14, wherein:
the electron beam entering the gun crossover has a Gaussian distribution; and
the aperture is configured to trim outlying portions of the Gaussian distribution as the electron beam passes through the aperture.

16. An electron-optical system, comprising:
an electron-beam source, comprising a cathode situated on an axis and configured to emit an electron beam propagating along the axis in a downstream direction from the cathode, the cathode comprising a transversely planar center portion and a transversely planar peripheral portion, the peripheral portion being drawn back in an upstream direction along the axis relative to the center portion;
a Wehnelt electrode situated coaxially downstream of the cathode, and an extraction electrode situated coaxially downstream of the Wehnelt electrode, the Wehnelt electrode and extraction electrode being configured to form a gun crossover; and
an aperture plate downstream of the gun crossover at a location conjugate to the gun crossover, the aperture plate defining an aperture situated on the optical axis.

17. The electron-optical system of claim 16, further comprising an electron lens situated on the optical axis downstream of the aperture plate.

18. The electron-optical system of claim 17, wherein:
the electron-beam source is configured to produce the electron beam with a Gaussian distribution that is characteristic of the electron beam as the electron beam passes through the aperture; and
the aperture is configured to trim outlying portions of the Gaussian distribution as the electron beam through the aperture.

19. An electron-optical system, comprising the electron-beam source of claim 1.

20. An electron-beam microlithography apparatus, comprising:
an electron-beam source comprising a cathode situated on an axis and configured to emit an electron beam propagating along the axis in a downstream direction from the cathode, the cathode comprising a transversely planar center portion and a transversely planar peripheral portion, the peripheral portion being drawn back in an upstream direction along the axis relative to the center portion;
an illumination-optical system situated along the axis downstream of the source and configured to receive the electron beam, propagating as an illumination beam from the source, and to direct the electron beam to a reticle so as to illuminate a region on the reticle; and
a projection-optical system situated along the axis downstream of the reticle and configured to receive the electron beam, propagating as a patterned beam from the reticle, and to direct the patterned beam to a substrate.

21. The apparatus of claim 20, wherein:
the electron-beam source further comprises a Wehnelt electrode situated coaxially downstream of the cathode, and an extraction electrode situated coaxially downstream of the Wehnelt electrode, the Wehnelt electrode and extraction electrode being configured to form a gun crossover; and
the illumination-optical system comprises an aperture plate situated downstream of the gun crossover at a location conjugate to the gun crossover, the aperture plate defining an aperture situated on the optical axis, and the illumination beam passing through the aperture to the reticle.

22. The electron-optical system of claim 21, wherein:
the electron-beam source is configured to produce the illumination beam with a Gaussian distribution;
the illumination beam incident on the aperture has the Gaussian distribution; and
the aperture is configured to trim outlying portions of the Gaussian distribution as the illumination beam passes through the aperture.

23. A microlithography apparatus, comprising the electron-optical system of claim 16.

24. A method for performing microlithography of a substrate, comprising the steps:
producing an illumination beam using an electron gun including a cathode arranged along an optical axis, the cathode including a transversely planar electron-emitting surface;
drawing back a transversely planar peripheral portion of the cathode in an upstream direction along the optical axis relative to a transversely planar center portion, so as to weaken a field imposed at the electron-emitting surface and increase uniformity of a field at an electron-emitting surface of the cathode;
passing the illumination beam through an illumination-optical system to a reticle, defining a pattern to be transferred to the substrate, to produce a respective patterned beam as electrons of the illumination beam pass through the reticle; and
passing the patterned beam through a projection-optical system to a sensitive substrate situated downstream of the reticle, so as to cause the patterned beam to produce an image on the substrate and thus transfer the pattern to the reticle.

25. The method of claim 24, further comprising the step of operating the electron gun in a temperature-limited region at a cathode temperature and cathode beam current sufficiently low such that electrons emitted from the cathode have characteristics reflective of the planar surface of the cathode.

26. The method of claim 24, further comprising the step of passing the illumination beam through a Wehnelt electrode and an extraction electrode both situated coaxially downstream of the cathode, the Wehnelt electrode and extraction electrode being configured to form a gun crossover of the illumination beam.

27. The method of claim 26, further comprising the step of passing the illumination beam through an aperture defined by an aperture plate situated downstream of the gun crossover at a location conjugate to the gun crossover, the aperture plate defining an aperture situated on the optical axis.

28. A microelectronic-device fabrication process, comprising the steps:

(a) preparing a wafer;

(b) processing the wafer; and (c) assembling microelectronic devices on the wafer during steps (a) and (b), wherein step (b) comprises the steps of (i) applying a resist to the wafer, (ii) exposing the resist, and (iii) developing the resist, and step (ii) comprises providing an electron-beam microlithography apparatus as recited in claim 20; and using the microlithography apparatus to expose the resist with the pattern defined on the reticle.

29. A microelectronic-device fabrication process, comprising the steps:

(a) preparing a wafer;

(b) processing the wafer; and (c) assembling microelectronic devices on the wafer during steps (a) and (b), wherein step (b) comprises the steps of (i) applying a resist to the wafer, (ii) exposing the resist, and (iii) developing the resist, and step (ii) comprises providing an electron-beam microlithography apparatus as recited in claim 23; and using the microlithography apparatus to expose the resist with the pattern defined on the reticle.

30. A microelectronic-device fabrication process, comprising the steps:

(a) preparing a wafer;

(b) processing the wafer; and (c) assembling microelectronic devices on the wafer during steps (a) and (b), wherein step (b) comprises the steps of (i) applying a resist to the wafer, (ii) exposing the resist, and (iii) developing the resist, and step (ii) comprises performing a microlithography method as recited in claim 24 to expose the resist with the pattern defined on the reticle.

\* \* \* \* \*

UNITED STATES PATENT AND TRADEMARK OFFICE
CERTIFICATE OF CORRECTION

PATENT NO. : 6,621,090 B2
DATED : September 16, 2003
INVENTOR(S) : Simizu

It is certified that error appears in the above-identified patent and that said Letters Patent is hereby corrected as shown below:

Column 2,
Line 41, "$J_c\ V_a^{2/3}$" should be -- $J_c \propto V_a^{2/3}$ --.

Column 6,
Line 26, "a second projection lens 27" should be -- a second projection lens 28 --.

Column 7,
Lines 46-47, "which an include" should be -- which can include --.

Signed and Sealed this

Sixth Day of April, 2004

JON W. DUDAS
*Acting Director of the United States Patent and Trademark Office*